(12) United States Patent
Hill et al.

(10) Patent No.: US 7,361,969 B2
(45) Date of Patent: Apr. 22, 2008

(54) CONTROLLED EQUIVALENT SERIES RESISTANCE CAPACITOR

(75) Inventors: Michael J. Hill, Gilbert, AZ (US);
Kemal Aygun, Chandler, AZ (US);
Kimberly D. Eilert, Mesa, AZ (US);
Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 332 days.

(21) Appl. No.: 11/177,805

(22) Filed: Jul. 8, 2005

(65) Prior Publication Data

US 2007/0007573 A1    Jan. 11, 2007

(51) Int. Cl.
*H01L 29/00* (2006.01)
(52) U.S. Cl. .................................................. 257/532
(58) Field of Classification Search ........ 257/295–310, 257/530–535
See application file for complete search history.

(56) References Cited

U.S. PATENT DOCUMENTS 6,353,540 B1 *   3/2002   Akiba et al. ................ 361/794

* cited by examiner

*Primary Examiner*—Cuong Nguyen
(74) *Attorney, Agent, or Firm*—David L. Guglielmi

(57) ABSTRACT

Some embodiments of the present invention include capacitors with controlled equivalent series resistance.

10 Claims, 4 Drawing Sheets

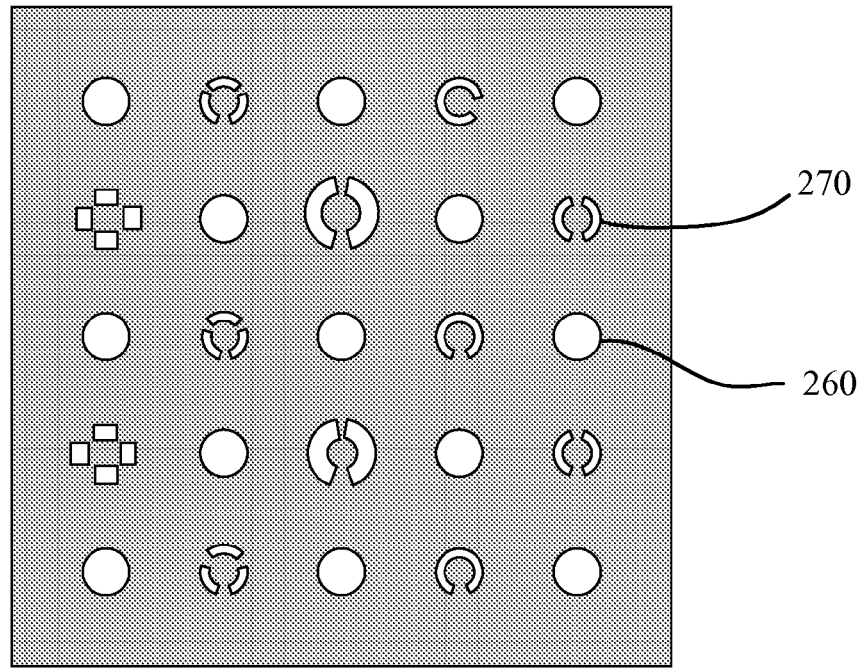
FIG. 2B (amended)

CONTROLLED EQUIVALENT SERIES RESISTANCE CAPACITOR

TECHNICAL FIELD

Embodiments of the invention relate to capacitor technology. In particular, embodiments of the invention relate to controlling the equivalent series resistance of capacitors.

BACKGROUND

A power delivery network may provide power to a microelectronic component, such as a microprocessor. It may be the goal of the power delivery network to provide the microelectronic component sufficient power at a nearly constant voltage. In order to provide a nearly constant voltage, many individual capacitors may be implemented in the power delivery network to provide a low equivalent series inductance (ESL) for the network. The numerous individual capacitors may be replaced by a single array capacitor (or a few array capacitors) because an array capacitor may also provide a low ESL. However, a single array capacitor may not provide an adequate equivalent series resistance (ESR) for the network.

In general, a capacitor stores energy in an electric field between a pair of conductive electrodes (i.e., positive and negative or power and ground). An array capacitor has several of the two types of conductive electrodes, or metal planes, separated by an insulating material and interleaved in a stack such that the electrodes alternate by type. Conductive interconnections are provided to connect each electrode to the other electrodes of the same type. The conductive interconnections do not connect electrodes of opposite type. Terminals are also provided to facilitate connection of the array capacitor to external components.

FIGS. 1A and 1B illustrate top-down views of a prior art array capacitor. FIG. 1A illustrates an electrode layer 100 of a first type including voids 110 and connection sites 120. FIG. 1B illustrates an electrode layer 150 of a second type including voids 160 and connection sites 170.

In an array capacitor, multiple electrode layers 100, 150 are alternated in an aligned stack and separated by an insulating material. In the aligned stack, conductive interconnections (not shown) for electrodes 100 connect to a first electrode 100 at connection sites 120, extend through the corresponding voids 160 of an adjacent electrode 150, and connect to the next electrode 100 in the stack. In such a manner, all electrodes 100 are interconnected. Similarly, conductive interconnections (not shown) for electrodes 150 connect to a first electrode 150 at connection sites 170, extend through corresponding voids 110 of an adjacent electrode 100, and connect to the next electrode 150 in the stack. Terminals (not shown) are provided for each electrode type so the capacitor may be connected to external electrical components.

BRIEF DESCRIPTION OF THE DRAWINGS

The invention is illustrated by way of example and not by way of limitation in the figures of the accompanying drawings, in which the like references indicate similar elements and in which:

FIGS. 2A-2C illustrate top-down type views of an apparatus in accordance with an embodiment of the present invention.

DETAILED DESCRIPTION

In various embodiments, apparatuses and methods relating to capacitors are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Capacitor quality may be enhanced by controlling the capacitor's equivalent series resistance (ESR). Specifically, it may be advantageous to control a capacitor's ESR without varying the electrical characteristics of the materials used to construct the capacitor, which may compromise other characteristics of the capacitor. In one application, when replacing numerous individual capacitors with a single array capacitor (or a few array capacitors) in a power delivery network, it may be advantageous to increase the inherently low ESR of an array capacitor because a high ESR may decrease voltage fluctuations and improve the performance of the power delivery network.

In one embodiment, a capacitor's ESR may be adjusted by providing gaps adjacent to connections between the interconnections and the electrodes of the capacitor, as is further discussed below.

Figure 1A:
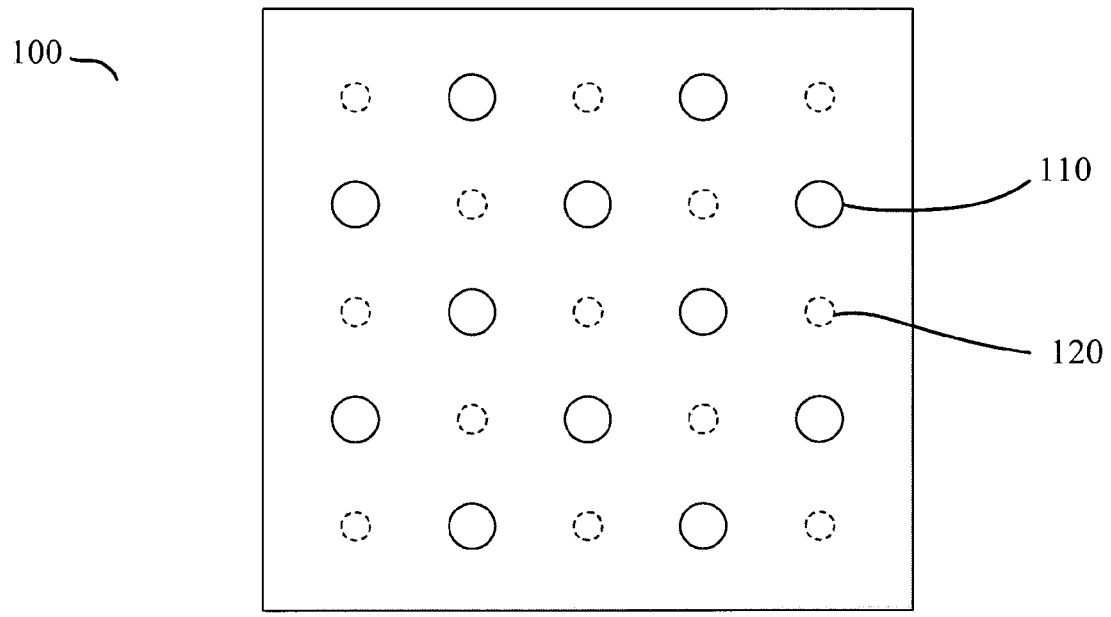
FIGS. 1A-1B illustrate top-down type views of a prior art apparatus.
Figure 1B:
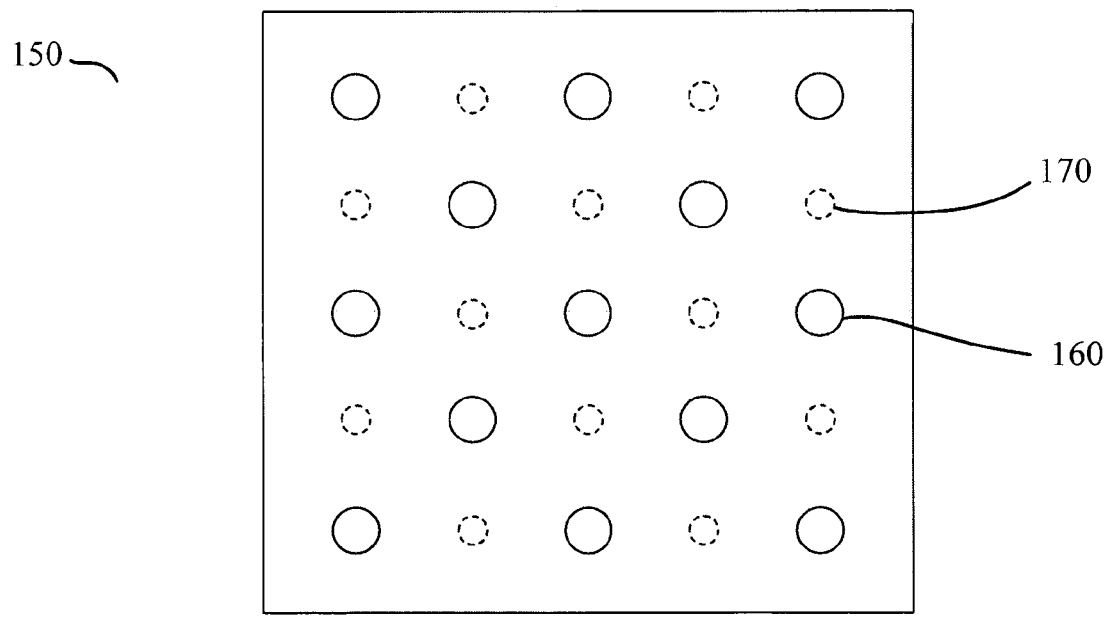
Figure 2A:
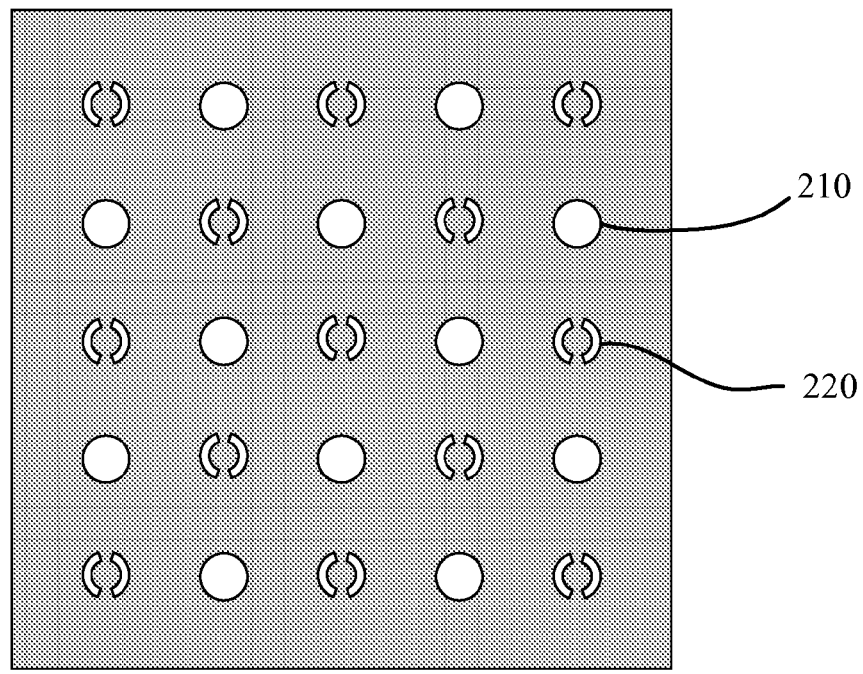
Figure 2C:
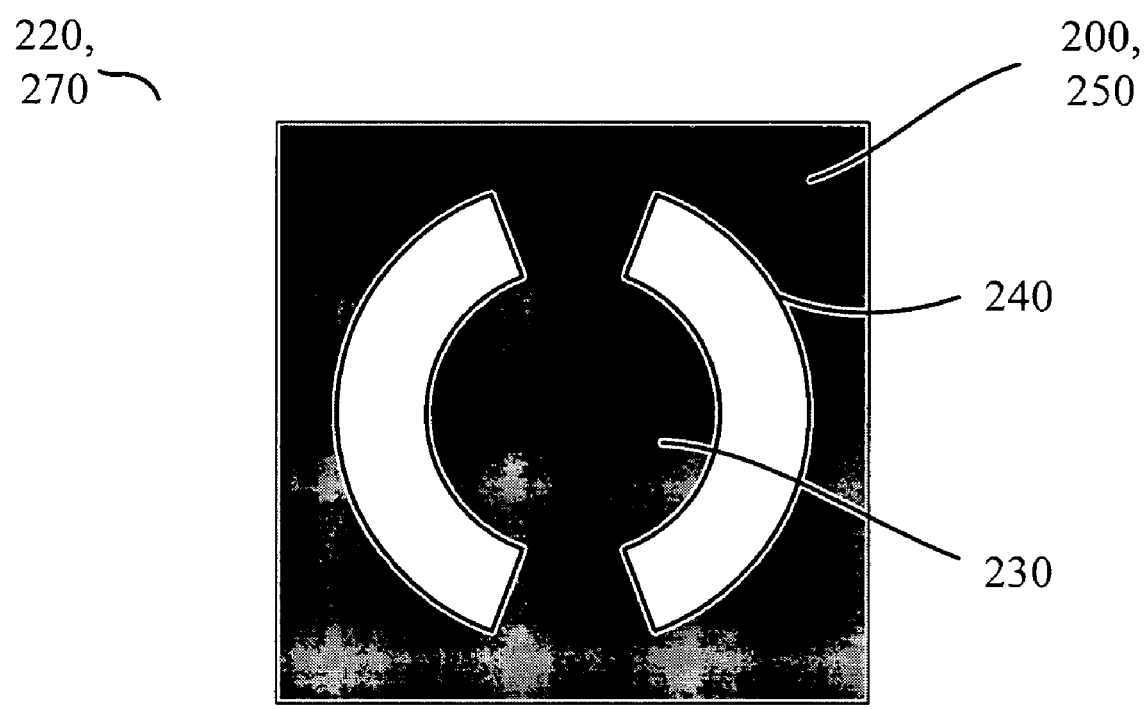

FIGS. 2A-2C illustrate top-down type views of an apparatus that may provide controlled ESR in a capacitor.

FIG. 2A illustrates an electrode layer 200 including voids 210 and connection structures 220. FIG. 2B illustrates an electrode layer 250 including voids 260 and connection structures 270. FIG. 2C illustrates a close up view of connection structures 220, 270 including a connection region 230 and gap region 340.

In an embodiment, electrode layers 200, 250 may be conductive planes. In an embodiment, electrode layers 200, 250 may include a metal. In another embodiment, electrode layers 200, 250 may be different types of electrodes, such as positive and negative or power and ground.

Electrode layers 200, 250 may be stacked in an alternating fashion to form an array capacitor. In an embodiment, an insulating material, such as a ceramic, may separate electrode layers 200, 250. Any number of electrode layers 200, 250 may be stacked in the array capacitor. In an embodiment, a few of each electrode layers 200, 250 may be stacked. In another embodiment, several hundred electrode layers 200, 250 may be stacked. In an alternating stack arrangement, voids 210 of electrode layers 200 may be aligned with connection structures 270 of electrode layers 250 and voids 260 of electrode layers 250 may be aligned with connection structures 220 of electrode layers 200.

A set of first conductive interconnections (not shown) may connect electrode layers 200 and a set of second conductive interconnections (not shown) may connect electrode layers 250. The first conductive interconnections may connect electrode layers 200 at connection structures 220 and extend through voids 260 of adjacent electrode layers 250 without contacting electrode layers 250. The second conductive interconnections may connect electrode layers 250 at connection structures 270 and extend though voids 210 of adjacent electrode layers 200 without contacting electrode layers 200. In an embodiment, the interconnections may include metal. In another embodiment, the interconnections may be posts. The interconnections may be of any shape and size, so long as they fit through voids 210, 260 without contacting the respective electrodes, and may generally be described as conductive elements.

Terminals (not shown) may be provided in order to connect the array capacitor to external electrical components. In an embodiment, the terminals may include conductive bumps. In another embodiment, the terminals may include pins or balls. In an embodiment, the terminals may correspond to and may be connected to the first and second conductive interconnections. In an embodiment, the array capacitor may be flip chip bonded to a printed circuit board (PCB) via the terminals.

Connection structures 220, 270 may provide a means to control the ESR of an array capacitor. A conductive interconnection, as discussed above, may be connected at connection region 230. As illustrated in FIG. 2C, gap region 240 may be provided between connection region 230 and the rest of electrode layer 200, 250. In an embodiment, gap region 240 may increase the ESR of the array capacitor due to decreasing the cross sectional area of the conductive path through the capacitor. In an embodiment, gap region 240 may include air. In another embodiment, gaps 340 may include an insulating material.

In an embodiment, connection region 230 may be completely covered by a conductive interconnection and gap region 240 may share an edge with the connection formed between the conductive interconnection and electrode layer 200, 250. In another embodiment, the conductive interconnection may not entirely cover connection region 230 and gap region 240 may be near the connection between the conductive interconnection and electrode 200, 250 without sharing an edge. In general, the connection between the conductive interconnection and electrode 200, 250 may be adjacent to gap region 240, that is, the gap may be near the connection or sharing an edge with the connection.

Gap region 240 may include any number of gaps or gap segments. In an embodiment, gap region 240 may include two gaps. In another embodiment, gap region 240 may include one gap. In other embodiments, gap region 240 may include one to ten gaps. Gap region 240 may include gaps of any suitable shape. In an embodiment, gap region 240 may include gaps being annular or ring shaped. In another embodiment, gap region 240 may include gaps in a shape that forms a partial ring around the connection. In another embodiment, gap region 240 may include gaps that may be square or rectangular in shape. The sizes, shapes, and orientations of the gaps that make up gap region 240 may vary throughout the capacitor or even within the same electrode layer. In an embodiment, some of connection structures 220, 270 may not include gap regions.

The selection of sizes, shapes, and orientations of gaps 240 throughout the capacitor may provide a design and manufacturing technique for controlling the ESR of the capacitor. In general, more and larger gaps may provide an increased ESR of the capacitor. In an embodiment, the size of the gap regions may be varied and chosen to meet a desired ESR. In another embodiment, the shapes of the gap regions may be varied and chosen to meet a desired ESR. In some embodiments, the size, shape, and orientations may be varied and chosen to meet a desired ESR.

As discussed, in some embodiments, the various embodiments described may be used in a power delivery network to provide power for a microelectronic device. In other embodiments, the above described apparatuses may provide decoupling, filtering, oscillation damping, and other benefits in electrical circuits.

Figure 3:
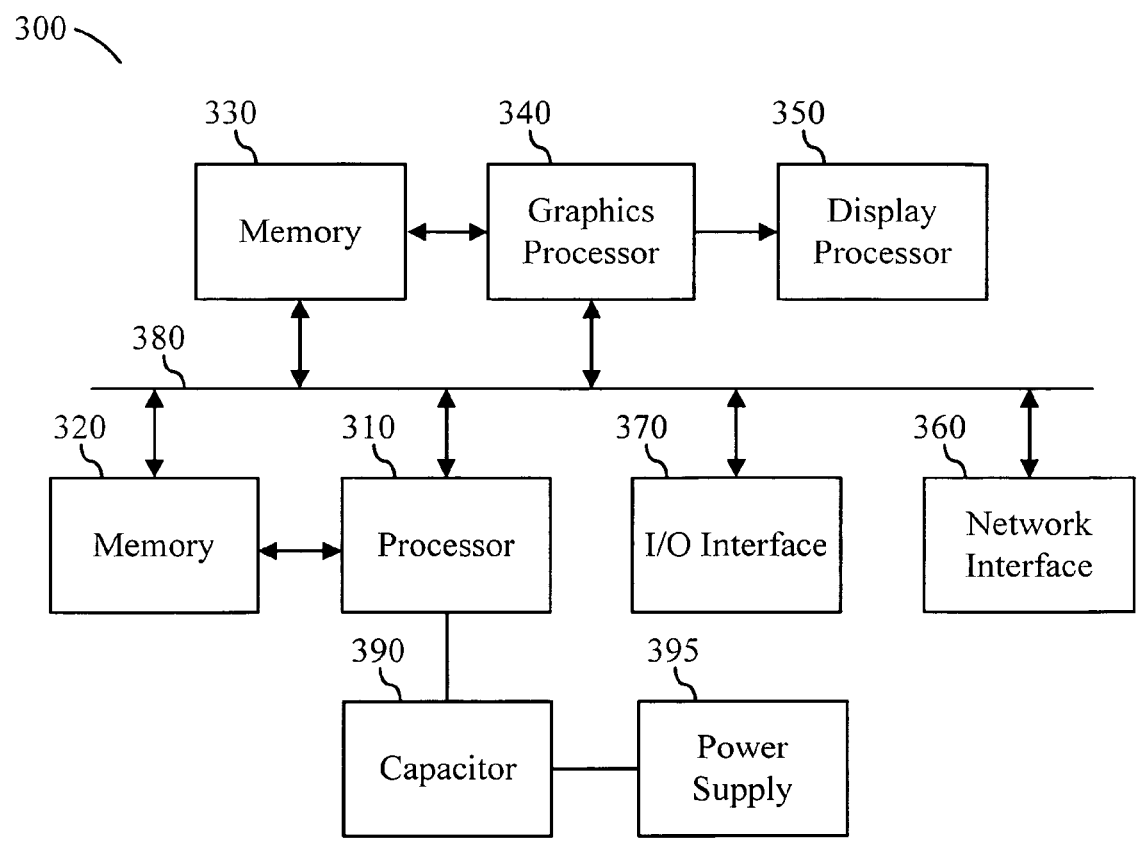
FIG. 3 illustrates a schematic of a system in accordance with an embodiment of the present invention.

As illustrated in FIG. 3, a capacitor 390 may be incorporated into a system 300. System 300 may include a processor 310, a memory 320, a memory 330, a graphics processor 340, a display processor 350, a network interface 360, an I/O interface 370, a communication bus 380, and a power supply 395. In an embodiment, capacitor 390 may be connected between power supply 395 and processor 330. In another embodiment, a capacitor (not shown) may be connected between the power supply and display processor 350. In other embodiments, a capacitor may be connected at various locations in system 300. In an embodiment, memory 320 may include a volatile memory component.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A capacitor comprising:
   a first electrode having a gap region;
   a second electrode having a void; and
   a conductive element extending through the void and connected to the first electrode adjacent to the gap region, wherein the gap region comprises two gap segments and the gap region forms a partial ring around the connection between the conductive element and the first electrode.

2. The capacitor of claim 1, wherein the first electrode and the second electrode comprise a metal.

3. The capacitor of claim 1, further comprising:
   a plurality of first electrodes and a plurality of second electrodes, wherein the first electrodes and second electrodes are alternated in an aligned stack;
   an insulating material between the first electrodes and second electrodes; and
   a plurality of interconnections connected to the first electrodes to form a plurality of connections, wherein the interconnections are routed through a plurality of voids in the second electrodes and do not contact the second electrodes.

4. The capacitor of claim 1, further comprising:
   a plurality of first terminals connected to the first electrodes; and
   a plurality of second terminals connected to the second electrodes.

5. A capacitor comprising:
   a first electrode having a first gap region;
   a second electrode having a void;

a conductive element extending through the void and connected to the first electrode adjacent to the first gap region; and a third electrode having a second gap region, wherein the conductive element is connected to the third electrode adjacent to the second gap region, wherein the first gap region and the second gap region are different sizes.

6. The capacitor of claim 5, wherein the first gap region comprises at least two gap segments.

7. The capacitor of claim 5, wherein the second gap region comprises at least two gap segments.

8. A capacitor comprising:
a first electrode having a first gap region;
a second electrode having a void;
a conductive element extending through the void and connected to the first electrode adjacent to the first gap region; and
a third electrode having a second gap region, wherein the conductive element is connected to the third electrode adjacent to the second gap region, wherein the first gap region and the second gap region are different shapes.

9. The capacitor of claim 8, wherein the first gap region comprises at least two gap segments.

10. The capacitor of claim 8, wherein the second gap region comprises at least two gap segments.

* * * * *